(12) United States Patent
Abuelma'atti et al.

(10) Patent No.: US 9,019,030 B1
(45) Date of Patent: Apr. 28, 2015

(54) MEMRISTOR-BASED EMULATOR FOR USE IN DIGITAL MODULATION

(71) Applicant: King Fahd University of Petroleum and Minerals, Dhahran (SA)

(72) Inventors: Muhammad Taher Abuelma'atti, Dhahran (SA); Zainualbideen Jamal Khalifa, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 14/490,631

(22) Filed: Sep. 18, 2014

(51) Int. Cl.
*H03C 3/00* (2006.01)
*H04L 27/12* (2006.01)
*G11C 13/00* (2006.01)

(52) U.S. Cl.
CPC ............ *H04L 27/122* (2013.01); *H04L 27/127* (2013.01); *H04L 27/12* (2013.01); *G11C 13/0009* (2013.01)

(58) Field of Classification Search
CPC ............................ G11C 13/0009; H04L 27/12
USPC ........... 365/148; 332/100, 103, 138; 361/437; 455/259; 706/15; 331/45; 375/259, 375/272, 279
See application file for complete search history.

(56) References Cited

U.S. PATENT DOCUMENTS

| | | | | |
|---|---|---|---|---|
| 8,188,773 | B1* | 5/2012 | Abuelma'atti | 327/134 |
| 8,416,604 | B2* | 4/2013 | Kim et al. | 365/148 |
| 8,854,148 | B1* | 10/2014 | Abuelma'atti | 331/135 |
| 8,860,518 | B1* | 10/2014 | Abuelma'atti et al. | 331/153 |

(Continued)

FOREIGN PATENT DOCUMENTS

CN 203219277 U 9/2013

OTHER PUBLICATIONS

Biolek et al., "Mutators for transforming nonlinear resistor into memristor," Proceedings of the 20th European Conference on Circuit Theory and Design (ECCTD), pp. 488-491, Aug. 29-31, 2011 (Abstract only).

(Continued)

*Primary Examiner* — Arnold Kinkead
(74) *Attorney, Agent, or Firm* — Richard C Litman

(57) ABSTRACT

A memristor-based emulator including a memristor circuit for use in digital modulation that includes a first current feedback operational amplifier (CFOA) having multiple terminals in communication with a capacitor $C_d$ and in further communication with a resistor $R_i$. A second CFOA having multiple terminals is in communication with the first CFOA and is adapted to be in further communication with a voltage $v_M$ to provide an input current $i_M$ for integration by a capacitor $C_i$. A nonlinear resistor is in communication with the second CFOA. A third CFOA having multiple terminals is in communication with the nonlinear resistor and is in further communication with the first CFOA and a resistor $R_d$. The third CFOA and the resistor $R_d$ act as an inverting amplifier associated with the nonlinear resistor to increase a current gain to increase a difference between ON and OFF values of a resistance of a realized memristor.

20 Claims, 8 Drawing Sheets

(56) References Cited

U.S. PATENT DOCUMENTS

| | | |
|---|---|---|
| 2011/0119036 A1 | 5/2011 | Pino et al. |
| 2012/0194967 A1* | 8/2012 | Keane et al. .................. 361/437 |
| 2013/0235647 A1* | 9/2013 | Kim .............................. 365/148 |

OTHER PUBLICATIONS

Sanchez-Lopez et al., "A simple floating memristor emulator circuit based on current conveyors," 2013 10th International Conference on Electrical Engineering, Computing Science and Automatic Control (CCE), Mexico City, pp. 445-448, Sep. 30, 2013-Oct. 4, 2013 (Abstract only).

Shin et al., "Compact Circuit Model and Hardware Emulation for Floating Memristor Devices," Circuits and Systems Magazine IEEE, vol. 13, issue 2, pp. 42-55, May 22, 2013 (Abstract only).

Yang et al., "Memristor emulator with off-the-shelf solid state components for memristor application circuits," 2012 13th International Workshop on Cellular Nanoscale Networks and Their Applications (CNNA),Turin, pp. 1-5, Aug. 29-31, 2012 (Abstract only).

Shin et al., "Small-area and compact CMOS emulator circuit for CMOS/nanoscale memristor co-design," Nanoscale Research Letters 2013, 8:454, Nov. 1, 2013, 7 pages.

* cited by examiner

MEMRISTOR-BASED EMULATOR FOR USE IN DIGITAL MODULATION

BACKGROUND OF THE INVENTION

1. Field of the Invention

The present invention relates to electronic circuitry and devices, and particularly to a memristor circuit and a memristor-based emulator for use in digital modulation.

2. Description of the Related Art

Since its inception many proposals and attempts have been reported on using a memristor in digital signal processing (DSP) circuits. Memristor-based DSP applications are mainly focusing on improving the performance of memories and in realizing synapses in neural networks. In most of the reported applications the verification of the DSP circuits is made using mathematical-based memristor models, for example.

A memristor can be considered a basic two-terminal element in electrical circuits that can directly relate a charge flow of electrons with a flux linkage. Therefore, the memristor can be considered as a resistor that changes as a flow of charges flows through it. Specifically, for a memristor, the change that occurs as the charges flow through the memristor does not revert to its original state when the power supply that is applied has been removed. Therefore, the memristor can be considered as having a memory property.

As more charge flows through terminals of the memristor, a state of the memristor will change to another value of resistance bounded by limits RON-ROFF. ROFF can represent a region with a relatively lower dopant concentration, which can indicate there is a relatively lower conductance. RON can represent a region with a relatively higher dopant concentration, which can indicate there is a relatively higher conductance. If a reverse flow of charges are passed through the memristor, the memristor can revert to the previous state. This memory property relates the memristance with a time variable, as well. Relatively important characteristics of the memristor can be the passivity of the memristor, the lack of a discharge of energy which can give the memristor a non-volatile property working as a memory, symmetry in the voltage-current (V-I) characterization curve, a frequency effect on a difference between the RON and ROFF limits, and a difference between applying a small AC signal and a large AC signal.

Different circuit memristor emulator models have been proposed for emulating a memristor or a memristive device. For example, one proposed circuit memristor emulator model uses a large number of active and passive elements; namely two operational amplifiers, four diodes, two Zener diodes, and several bipolar and junction gate field-effect transistor (JFET) transistors in addition to a large number of resistors and capacitors. This type of proposed circuit memristor emulator model typically requires a significant amount of components, as can make it less practical and cost prohibitive. Another proposed circuit memristor emulator model is a coupled variable resistor model, such as a Simulation Program with Integrated Circuit Emphasis (SPICE) model. This proposed circuit memristor emulator model is based on using controlled voltage and current sources available in SPICE. Therefore, by implementing the SPICE model, this proposed circuit memristor emulator model is typically suitable for computer aided simulation, but typically not for use in hardware practical experimentation and testing of memristor-based circuits, for example. Another proposed circuit memristor emulator model is a charge controlled memristor model in a SPICE implementation, for example.

Similarly, another proposed circuit memristor emulator model emulator model consists of a set of analytical equations that can be relatively easily implemented by a Verilog-A language for circuit design and can be relatively easily embedded in SPICE-based simulators. Another proposed circuit memristor emulator model uses a digital potentiometer, an analog-to-digital converter and a microcontroller. Another proposed circuit memristor emulator model is an analog emulator that uses five operational amplifiers, one of them with stringent conditions, a JFET, a floating capacitor and a large number of resistors. In this proposed circuit memristor emulator model, the JFET provides the nonlinear load resistance. The drawbacks with using this proposed circuit memristor emulator model relate to its relative complexity and it is not typically suitable for use as a two terminal device in relatively more complicated circuits. Another example of a proposed circuit memristor emulator model involves a light emitting diode (LED) to provide the nonlinearity, two current-feedback operational amplifiers (CFOAs) and one voltage-feedback operational amplifier (OA), two grounded capacitors and two resistors with one of two resistors floating.

Other implementations of proposed circuit memristor emulator models involve using three or four CFOAs and a number of resistors and capacitors. Moreover, rather than using the commercially available integrated circuit CFOAs, proposed circuit memristor emulator models can be realized using micro-power operational amplifiers. Another proposed circuit memristor emulator model uses three operational amplifiers, one floating capacitor, a large number of resistors, and a light dependent resistor (LDR) and optocoupler to provide the nonlinear load. Another proposed circuit memristor emulator model involves both incremental and decremental memristors. The memristor emulator uses five operational amplifiers, one grounded capacitor, an analog multiplier, a large number of resistors and metal-oxide-semiconductor field-effect transistor (MOSFET) transistors; mostly working as current mirrors, and an analog multiplier, for example.

Another proposed circuit memristor emulator model is a nonlinear resistor that can be transformed into a memristor using a plus-type second-generation current-conveyor (CCII+) and a minus-type current-follower (CF−), a capacitor, an inductor and a nonlinear load resistance; built using a diode and two resistors. Another proposed circuit memristor emulator model includes two operational amplifiers, a floating capacitor, a relatively large number of resistors, and an analog multiplier. Another proposed circuit memristor emulator model uses two analog multipliers, one operational amplifier, an integrator and a number of resistors. Another proposed circuit memristor emulator model uses analog-to-digital, digital-to-analog converters and a microcontroller unit in addition to analog controlled voltage/current sources.

Therefore, the above mentioned proposed circuit memristor emulator models appear to likely have one or more drawbacks. For example, the above mentioned proposed circuit memristor emulator models can be rather complex, either using a large number of active and passive components, or a combination of analog and digital integrated circuits or they can require stringent matching conditions. Another example of a drawback is that the proposed circuit memristor emulator model may be suitable only for computer-aided simulation and typically cannot be used for hardware implementation and experimental testing. Another example of a drawback is that the proposed circuit memristor emulator models may not be suitable for integration into more complicated circuits.

Another example of a drawback is that various of the proposed circuit memristor emulator models use floating capacitors and/or resistors, which may not be suitable for on-chip integration and further may not be easy to minimize the effect of any parasitic capacitors and resistors in a discrete implementation. Another example of a drawback is if the proposed circuit memristor emulator models use an inductor, such inductor use may not be suitable for integration into relatively more complicated circuits. Another example of a drawback is that if the proposed circuit memristor emulator model has a relatively large input impedance, such relatively large impedance can make it suitable for being driven by a voltage but not for being driven by a current.

Therefore, it is desirable for a memristor-based emulator to have a relatively lesser amount of active and passive components and to not require stringent matching conditions. Also, it is desirable for a memristor-based emulator that can be used for hardware implementation and experimental testing, as well as it is desirable for a memristor-based emulator to be suitable for integration into relatively more complicated circuits. Further, it is desirable for a memristor-based emulator to be suitable for on-chip integration, as well as having the ability to minimize the effect of parasitic capacitors and resistors in discrete implementation. Also, it is desirable for a memristor-based emulator to have a relatively smaller input impedance so that it can be driven by a current.

Thus, a memristor-based emulator for use in digital modulation addressing the aforementioned problems is desired.

SUMMARY OF THE INVENTION

Embodiments of a memristor-based emulator for use in digital modulation are provided that include at least one memristor circuit. The memristor circuit of the memristor-based emulator includes a first current feedback operational amplifier (CFOA) that has a w-terminal, an x-terminal, a y-terminal, and a z-terminal. The first CFOA is in communication with a capacitor $C_d$ at the x-terminal and is also in further communication with a resistor $R_i$ at the z-terminal. A second CFOA having a w-terminal, an x-terminal, a y-terminal, and a z-terminal, is in communication with the w-terminal of the first CFOA. The second CFOA is also in communication with a voltage $v_M$ that provides an input current $i_M$ for integration by a capacitor $C_i$.

A nonlinear resistor includes a first resistor $R_1$ and second resistor $R_2$ in a parallel relationship and also includes a germanium diode D, wherein the integrated input current $i_M$ is scaled through the nonlinear resistor. The nonlinear resistor is in communication with the second CFOA at the w-terminal of the second CFOA. The memristor circuit of the memristor-based emulator also includes a third CFOA that has a w-terminal, an x-terminal, a y-terminal, and a z-terminal. The third CFOA is in communication with the nonlinear resistor through the x-terminal of the third CFOA and the w-terminal of the third CFOA is in communication with the y-terminal of the first CFOA. Further, the z-terminal of the third CFOA is in communication with a resistor $R_d$, wherein the third CFOA and the resistor $R_d$ act as an inverting amplifier associated with the nonlinear resistor to increase a current gain to increase a difference between the ON value of a resistance and an OFF value of a resistance of a realized memristor of the memristor circuit.

These and other features of the present invention will become readily apparent upon further review of the following specification and drawings.

BRIEF DESCRIPTION OF THE DRAWINGS

Unless otherwise indicated, similar reference characters denote corresponding features consistently throughout the attached drawings.

DETAILED DESCRIPTION OF THE PREFERRED EMBODIMENTS

Figure 1A:
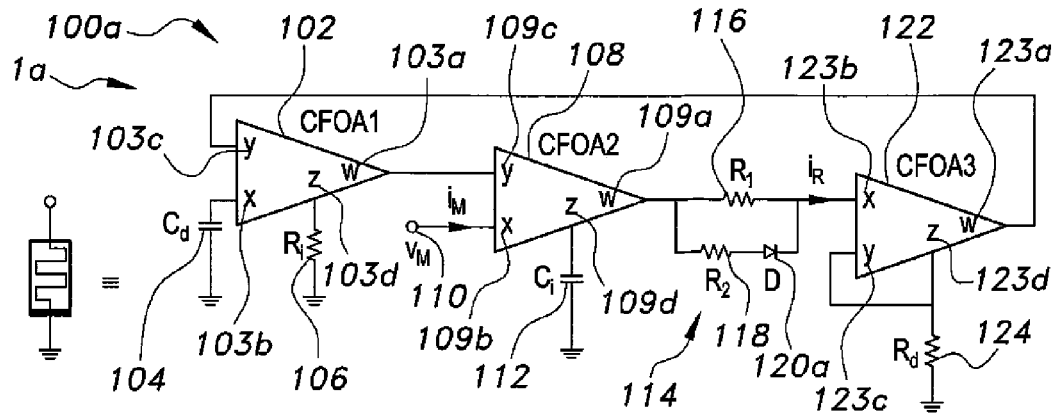
FIG. 1A is a schematic diagram of an embodiment of a decremental memristor circuit of a decremental memristor-based emulator of embodiments of a memristor-based emulator for use in digital modulation according to the present invention.
Figure 1B:
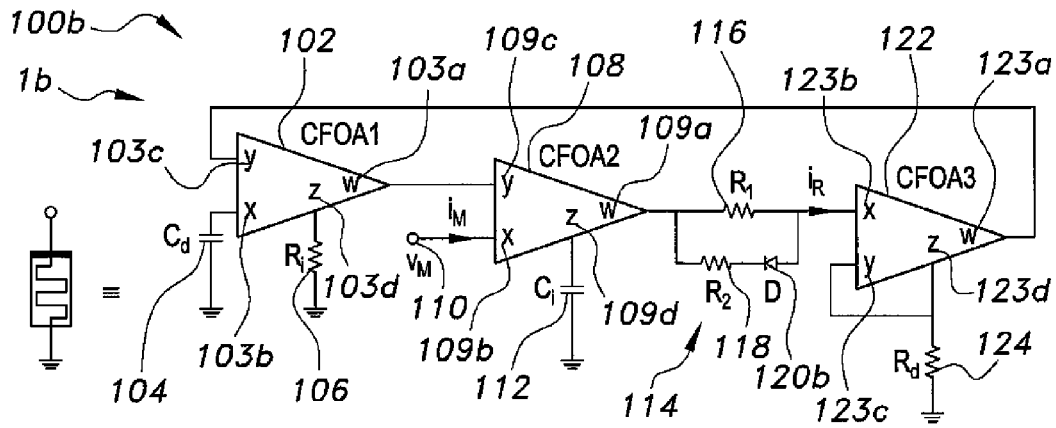
FIG. 1B is a schematic diagram of an embodiment of an incremental memristor circuit of an incremental memristor-based emulator of embodiments of a memristor-based emulator for use in digital modulation according to the present invention.

Referring to FIGS. 1A and 1B, embodiments of a memristor circuit of a memristor-based emulator are provided. As shown in FIG. 1A, a decremental memristor-based emulator 1a includes a decremental memristor circuit 100a, and as shown in FIG. 1B, an incremental memristor-based emulator 1b includes an incremental memristor circuit 100b. Both the decremental memristor circuit 100a and the incremental memristor circuit 100b include a first current feedback operational amplifier (CFOA) 102. The first CFOA 102 (CFOA1) of the decremental memristor circuit 100a and the incremental memristor circuit 100b has a w-terminal 103a, an x-terminal 103b, a y-terminal 103c, and a z-terminal 103d. The first CFOA 102 is in communication with a capacitor $C_d$ 104 at the x-terminal 103b and is also in communication with a resistor $R_i$ at the z-terminal 103d of the first CFOA 102.

Continuing with FIGS. 1A and 1B, both the decremental memristor circuit 100a and incremental memristor circuit 100b include a second CFOA 108 (CFOA2). Similar to the first CFOA 102, the second CFOA 108 has a w-terminal 109a, an x-terminal 109b, a y-terminal 109c, and a z-terminal 109d. The y-terminal 109c of the second CFOA 108 is in communication with the w-terminal 103a of the first CFOA 102, thereby allowing for the first CFOA 102 to be directly in communication with the second CFOA 108. Concerning the x-terminal 109b of the second CFOA 108, the x-terminal 109b is in communication with a voltage $v_M$ 110. The voltage $v_M$ 110 provides an input current $i_M$ that is integrated by a capacitor $C_i$ 112 that is in communication with the z-terminal 109d.

A nonlinear resistor 114 is also included in both the decremental memristor circuit 100a and the incremental memristor circuit 100b. The nonlinear resistor 114 includes a first resistor $R_1$ 116 and second resistor $R_2$ 118 that are in a parallel relationship with respect to each other, as shown in FIGS. 1A and 1B. Further included in the nonlinear resistor 114 of the decremental memristor circuit 100a is a diode D 120a oriented therein to realize a decremental memristor, and included in the nonlinear resistor 114 of the incremental memristor circuit 100b is a diode D 120b oriented therein to realize an incremental memristor. The diode D 120a and diode D 120b can each be a germanium diode as opposed to a light emitting diode (LED), for example. The nonlinear resistor 114 is in communication with the second CFOA 108 at the w-terminal 109a of the second CFOA 108.

A third CFOA (CFOA3) 122 is included in both decremental memristor circuit 100a of FIG. 1A and the incremental memristor circuit 100b of FIG. 1B. Similar to the first CFOA 102 and the second CFOA 108, the third CFOA 122 includes a w-terminal 123a, an x-terminal 123b, a y-terminal 123c, and a z-terminal 123d. The third CFOA 122 is in communication with the nonlinear resistor 114 through the x-terminal 123b of the third CFOA 122. Further, the w-terminal 123a of the third CFOA 122 is in communication with the y-terminal 103c of the first CFOA 102. The third CFOA 122 is also in communication with a resistor $R_d$ by way of the z-terminal 123d of the third CFOA 122. By having the third CFOA 122 in communication with a resistor $R_d$ 124, the third CFOA 122 and the resistor $R_d$ 124 act as an inverting amplifier associated with the nonlinear resistor 114 to increase a current gain to increase a difference between the ON and OFF values of the resistances of a realized memristor, for example, such as realized by the decremental memristor circuit 100a of FIG. 1A and the incremental memristor circuit 100b of FIG. 1B.

The decremental memristor circuit 100a of the decremental memristor-based emulator 1a and the incremental memristor circuit 100b of the incremental memristor-based emulator 1b both operate to satisfy characteristic equations and relations between a charge through a mutator and a flux linkage, as shown in equations (1) and (2) below:

$$v_R = \frac{-1}{C_i} \int i_M dt + i_R R_d \tag{1}$$

and $$v_M = -R_i R_d C_d \frac{d}{dt} i_R. \tag{2}$$

The input current $i_M$ can be integrated by the capacitor $C_i$ and then scaled through the non-linear resistor 114, which has been noted above includes the resistors $R_1$ 116 and $R_2$ 118 and the corresponding diode D 120a or diode D 120b, with the inverting amplifier formed of the third CFOA 122 and the resistor $R_d$ 124. An output signal of the non-linear scalar is then differentiated by the capacitor $C_d$ 104 to obtain the voltage $v_M$. Thus, the relationships between the input voltage $v_M$ and the input current $i_M$, and the voltage $v_R$ across the nonlinear resistor 114 and the current $i_R$ through the nonlinear resistor 114 can be expressed as the equations (1) and (2) shown above.

Figure 2:
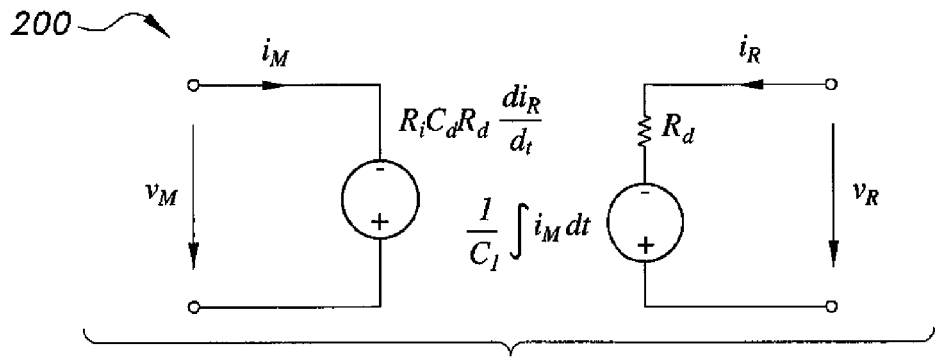
FIG. 2 is a schematic diagram of an embodiment of a memristor model of embodiments of a memristor circuit of a memristor-based emulator for use in digital modulation according to the present invention.

Equations (1) and (2) can be represented schematically diagram 200, as shown in FIG. 2. This schematic diagram 200 can be equivalent to transferring a current-controlled resistor into a flux-controlled memristor. If a resistance is connected in parallel with the capacitor $C_i$ 112 then the input current $i_M$ can be integrated by a nonideal integrator formed of capacitor $C_i$ 112 in parallel with a resistance. The equivalent circuit of the diagram 200 of FIG. 2 can remain valid except that the integrator is nonideal. If the input current $i_M$ is a sinusoidal current of the form $i_M = I_{max} \sin \omega t$ and the voltage $v_R$ can be expressed as $v_R = i_R R_{eq}$, where $R_{eq}$ is the effective equivalent resistance of $R_1$ 116 and $R_2$ 118 depending on the state of the corresponding diode D 120a or diode D 120ab, then using equations (1) and (2) and assuming that $R_{eq}$ is always larger than $R_d$, it is relatively easy to show that equivalent resistance of the memristor M, such as realized by the decremental memristor 100a of FIG. 1A and by the incremental memristor circuit 100b of FIG. 1B, can be expressed as the following equation (3) below:

$$M = \frac{R_i R_d C_d}{(R_{eq} - R_d) C_i}. \tag{3}$$

Equation (3) implies that a memristor is equivalent to a resistor which is dependent on $R_{eq}$. Since $R_{eq}$ can acquire two different values depending on the status of the corresponding diode D 120a or diode D 120b, then equation (3) implies that the memristor, such as realized by the decremental memristor circuit 100a of FIG. 1A and by the incremental memristor circuit 100b of FIG. 1B, can acquire two values of resistance that is RON, the ON resistance value of the realized memristor, and ROFF, the OFF resistance value of the realized memristor, for example.

Thus, the decremental memristor circuit 100a of the decremental memristor-based emulator 1a and the incremental memristor circuit 100b of the incremental memristor-based emulator 1b of FIGS. 1A and 1B respectively, can enjoy several advantages, such as the nonlinear resistance is realized using a germanium diode, as the diode D 120a or the diode D 120b, rather than an LED. Another advantage is the use of a current feedback operational amplifier (CFOA) instead of an operational amplifier, to realize the inverting amplifier associated with the nonlinear resistance. This can allow for obtaining higher gain likely without facing a problem or a substantial problem of limited gain-bandwidth product of the operational amplifier. This can result in large difference between the ON value of a resistance and the OFF value of a resistance of the realized memristor, such as realized by the decremental memristor circuit 100a of FIG. 1A and by the incremental memristor circuit 100b of FIG. 1B.

Another advantage is that the decremental memristor circuit 100a of the decremental memristor-based emulator 1a and the incremental memristor circuit 100b of the incremental memristor-based emulator 1b of FIGS. 1A and 1B, respectively, have relatively low input impedances. Thus, compared to the high input impedance realization of other proposed circuit emulator models, the decremental memristor-based emulator circuit 100a and the incremental memristor-based emulator circuit 100b of FIGS. 1A and 1B can be relatively easily integrated with other circuits in that the realized memristor, such as realized by the decremental memristor circuit 100a of the decremental memristor-based emulator 1a and by the incremental memristor circuit 100b of the incremental memristor-based emulator 1b of FIGS. 1A and 1B, is driven by a current rather than a voltage, for example.

Figure 3A:
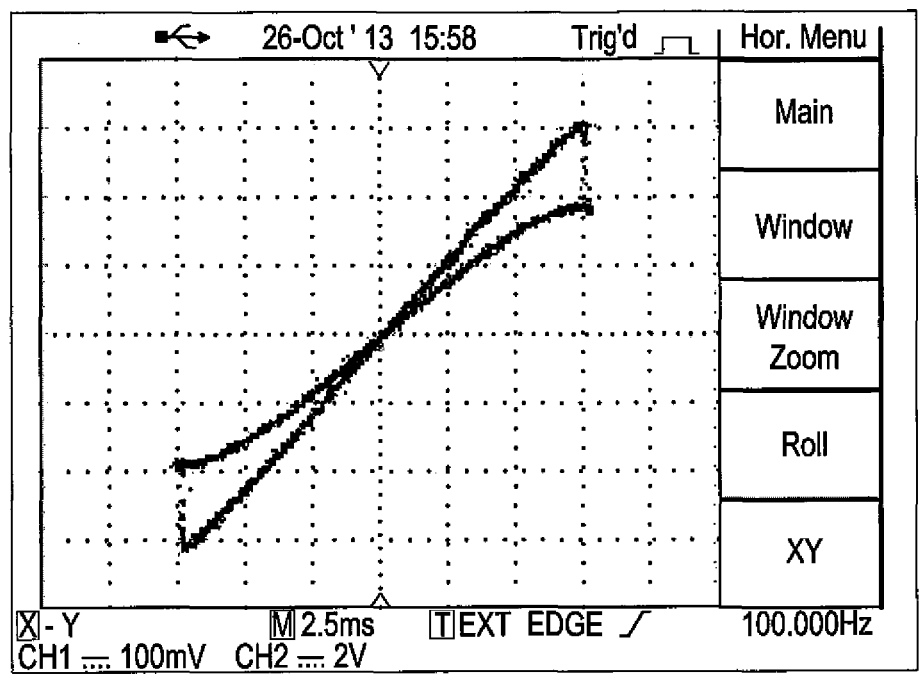
FIG. 3A is a graph of experimental data for current-voltage characteristics at 100 Hertz (Hz) for embodiments of a memristor circuit of a memristor-based emulator for use in digital modulation according to the present invention.
Figure 3B:
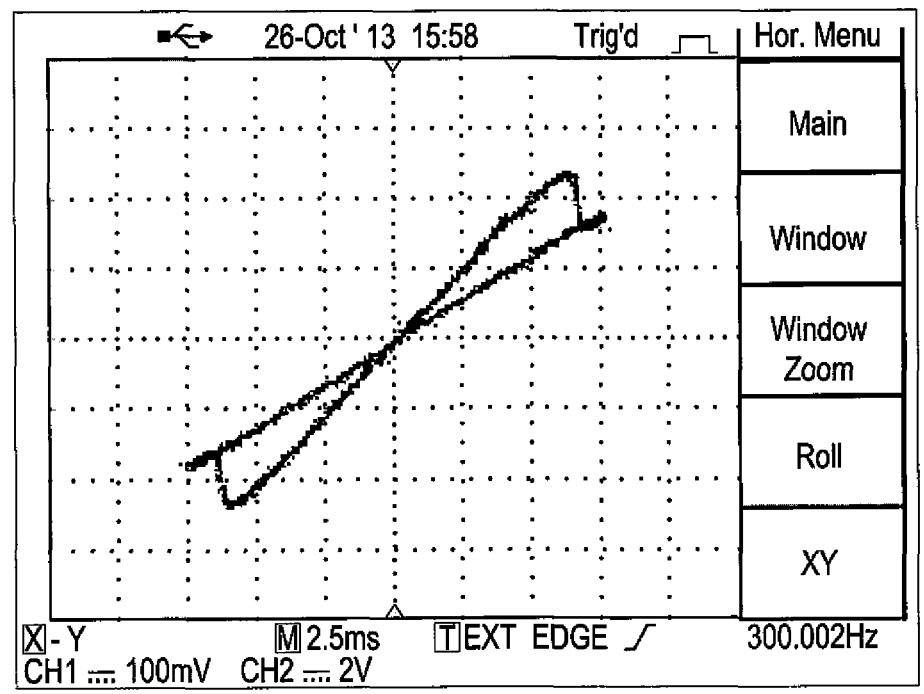
FIG. 3B is a graph of experimental data for current-voltage characteristics at 300 Hz for embodiments of a memristor circuit of a memristor-based emulator for use in digital modulation according to the present invention.
Figure 3C:
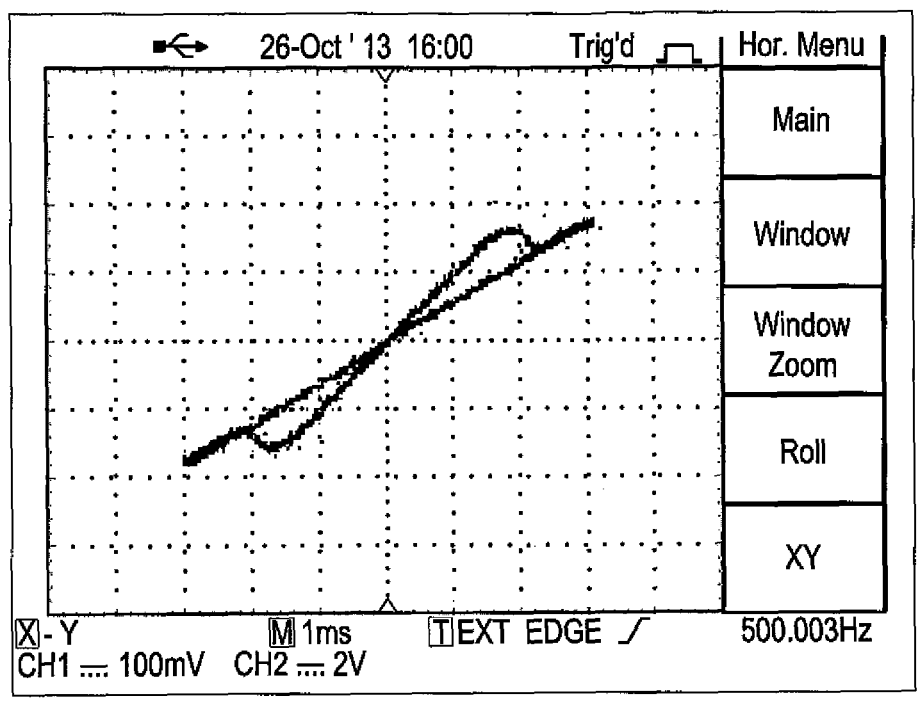
FIG. 3C is a graph of experimental data for current-voltage characteristics at 500 Hz for embodiments of a memristor circuit of a memristor-based emulator for use in digital modulation according to the present invention.
Figure 3D:
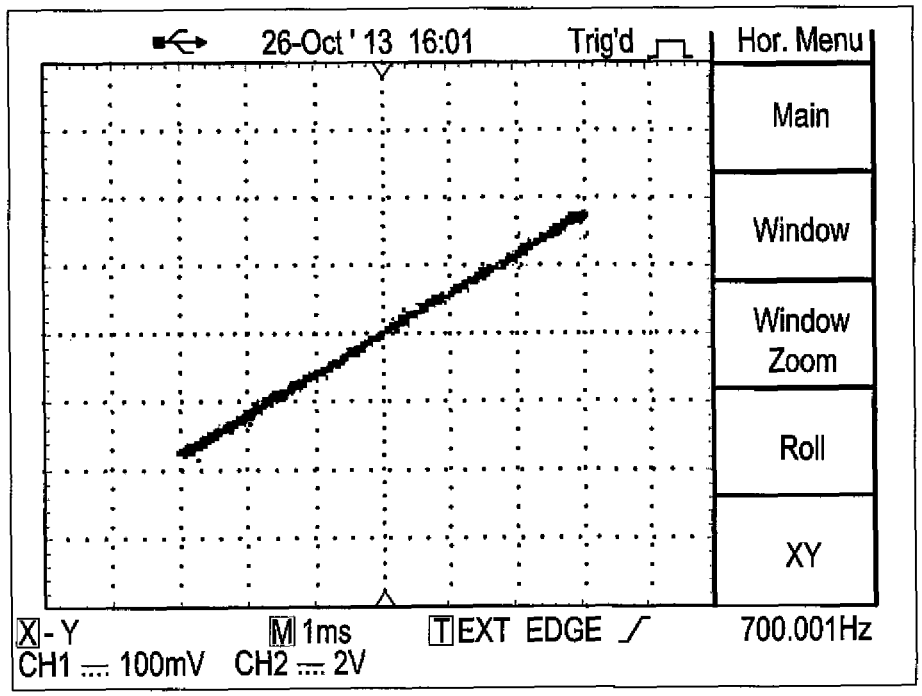
FIG. 3D is a graph of experimental data for current-voltage characteristics at 700 Hz for embodiments of a memristor circuit of a memristor-based emulator for use in digital modulation according to the present invention.
Figure 3E:
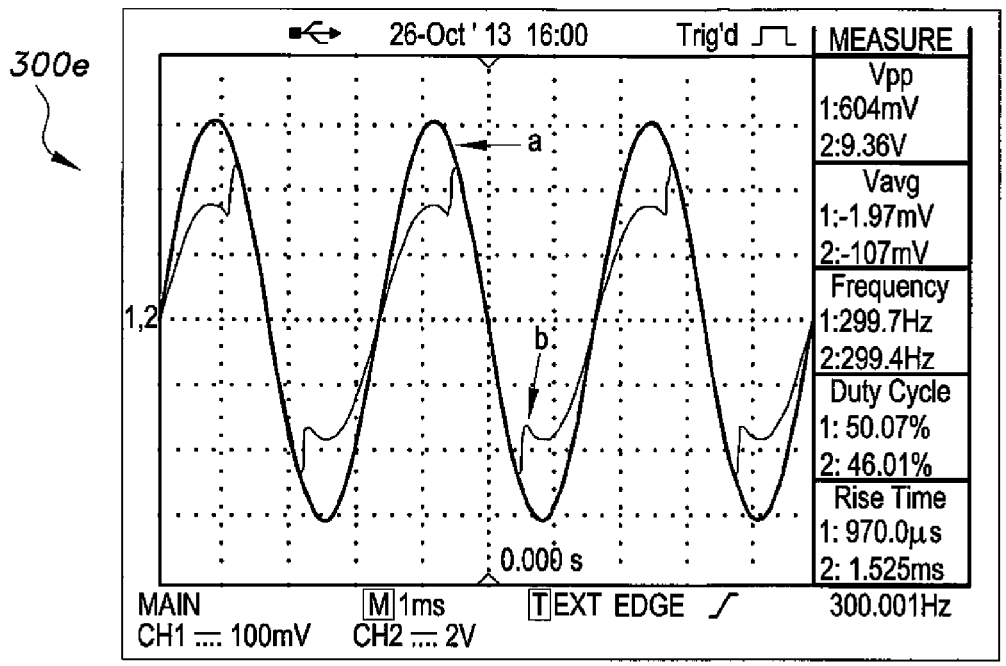
FIG. 3E is a graph of experimental data for current injected (a) and voltage sensed (b) at 300 Hz for embodiments of a memristor circuit of a memristor-based emulator for use in digital modulation according to the present invention.
Figure 3F:
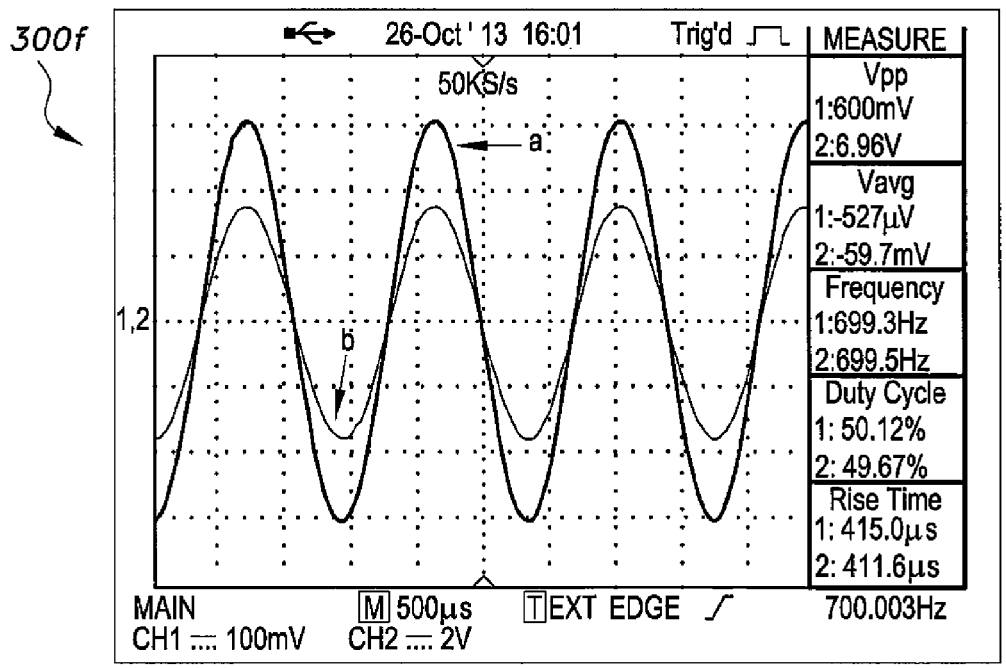
FIG. 3F is a graph of experimental data for current injected (a) and voltage sensed (b) at 700 Hz for embodiments of a memristor circuit of a memristor-based emulator for use in digital modulation according to the present invention.

Referring to FIGS. 3A-3F, experiments were performed to verify the operation of the decremental memristor circuit 100a of the decremental memristor-based emulator 1a and the incremental memristor circuit 100b of the incremental memristor-based emulator 1b of FIGS. 1A and 1B. The memristor circuits 100a and 100b shown in FIGS. 1A and 1B were implemented with $C_d = C_i = 100$ nF, $R_1 = 9.1/k\Omega$, $R_2 = 3$ k$\Omega$. The resistors $R_i$ and $R_d$ were adjusted to be 27.5 k$\Omega$ and 2.891 k$\Omega$ respectively. AD844 CFOAs and germanium diode OA91 were used for these experiments and experimental verification, with the results shown in FIGS. 3A-3F. The data obtained and shown in the respective graphs 300a-300d of FIGS. 3A-3D, shows that the memristor circuits 100a and 100b of FIGS. 1A and 1B can emulate memristor performance. Inspection of the respective graphs 300e and 300f of FIGS. 3E and 3F show that as the frequency increases, the memristor performance of the memristor circuits 100a and 100b tends to approach a normal linear resistance with no tie bow, for example.

The current-voltage characteristics of the low impedance input of the decremental memristor circuit 100a of the memristor-based emulator 1a and the incremental memristor circuit 100b of the incremental memristor-based emulator 1b of FIGS. 1A and 1B are measured at different frequencies. For FIG. 3A, the frequency is set at about 100 Hz. For FIG. 3B, the frequency is set at about 300 Hz. For FIG. 3C, the frequency is set at about 500 Hz. For FIG. 3D, the frequency is set at about 700 Hz. For FIG. 3E, the current injected (a) and the voltage sensed (b) is set at about at 300 Hz. For FIG. 3F, the current injected (a) and the voltage sensed (b) is set at about 700 Hz.

The functionality of the emulator memristor circuits 100a and 100b of FIGS. 1A and 1B were further tested by using the decremental memristor circuit 100a of the memristor-based emulator 1a and the incremental memristor circuit 100b of the incremental memristor-based emulator 1b of FIGS. 1A and 1B in designing digital modulation circuits, such as amplitude-shift keying (ASK), frequency-shift keying (FSK) and binary phase-shift keying (BPSK). These techniques and circuits are widely used in digital communication to convert a unipolar bit sequence into an appropriate form for modulation and transmission. In this regard, memristor based ASK, FSK and BPSK circuits have been used, such as an ASK modulator using single memristor, an FSK modulator using two memristors and a BPSK using two memristors. However, in such uses two values of memristances were assumed with RON much smaller than ROFF. Also, in such uses, a preprocessor circuit is typically needed as the control signal that will control the state level of the memristor, as well as results were obtained using SPICE models.

Figure 4:
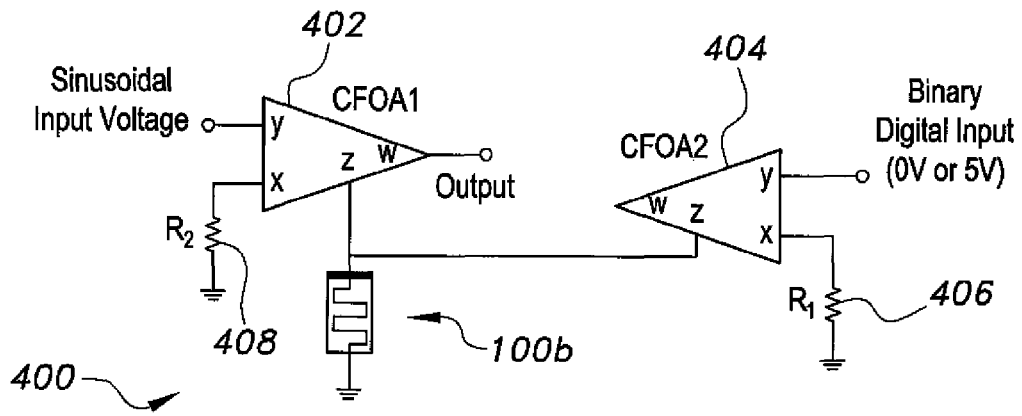
FIG. 4 is a schematic diagram of an embodiment of an amplitude-shift keying (ASK) circuit for use with the memristor circuit of the memristor-based emulator of FIG. 1B for generating ASK signals according to the present invention.

Referring to FIG. 4, an ASK circuit 400 for use in conjunction with the incremental memristor circuit 100b of the incremental memristor-based emulator 1b of FIG. 1B for generating ASK signals. The operation of the ASK circuit 400 in FIG. 4 can be explained as follows. With the sinusoidal input voltage set to zero, the current obtained from the z-terminal of a second CFOA (CFOA2) 404 of the ASK circuit 400 will bias the memristor circuit 100b. Thus, the memristor circuit 100b will have either a low resistance or a high resistance depending on the unipolar binary digital input. In fact, a first CFOA (CFOA1) 402 of the ASK circuit 400 is configured as a voltage amplifier with voltage gain=M/$R_1$, where M is the resistance of the memristor circuit 100b. With M having two values (RON and ROFF), depending on the current injected from the second CFOA 404, the gain of the first CFOA 402 can have two different values depending on the unipolar binary digital input. Thus, the sinusoidal input voltage at the y-terminal of the first CFOA 402 will appear at the output with two different gains giving an ASK. A typical ASK output signal obtained using the ASK circuit 400 having resistances $R_1$ 406 and $R_2$ 408 with $R_1$=47 k$\Omega$, and $R_2$=4.7 k$\Omega$ is shown in a graph 500 of FIG. 5. In the graph 500 of FIG. 5, the bottom trace is the input digital signal to the ASK circuit 400 and the upper trace is the resulting ASK.

Figure 6:
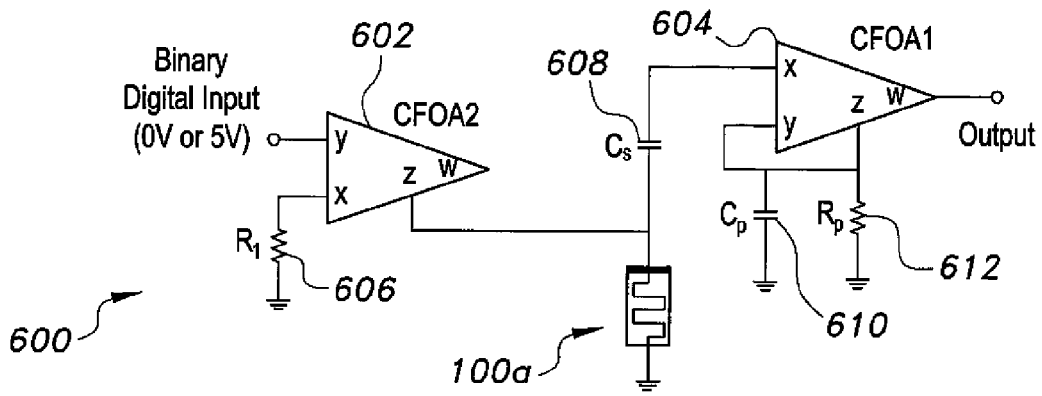
FIG. 6 is a schematic diagram of an embodiment of a frequency-shift keying (FSK) circuit for use with the memristor circuit of the memristor-based emulator of FIG. 1A for generating FSK signals according to the present invention.

Referring to FIG. 6, a FSK circuit 600 for use in conjunction with the decremental memristor circuit 100a of the decremental memristor-based emulator 1a of FIG. 1A for generating FSK signals is shown. The operation of the FSK circuit 600 of FIG. 6 can be explained as follows. The current-feedback operational-amplifier based circuit is used to convert a binary digital input signal into a current. This current is used to bias the memristor circuit 100a connected to a z-terminal of a second CFOA (CFOA2) 602 of the FSK circuit 600. A resistor $R_1$ is in communication with the x-terminal of the second CFOA (CFOA2) 602. A first CFOA (CFOA1) 604 of the FSK circuit 600 is configured as a sinusoidal oscillator with a frequency of oscillation given by $$\omega_0^2 = \frac{1}{C_s C_p R_p M},$$

where M is the resistance of the memristor circuit 100a. By M having two values, depending on the current injected from second CFOA 602, the frequency of oscillation of the first CFOA 604 can have two different values depending on the unipolar binary digital input. Thus, the sinusoidal output voltage at the w-terminal of the first CFOA 604 will appear at two different frequencies giving a FSK. A typical output FSK signal obtained with a resistor $R_p$ 612, a capacitor $C_p$ 610 and a capacitor $C_s$ 608 with $R_p$=25 k$\Omega$, $C_p$=3.3 nF and $C_s$=4.7 nF is shown in a graph 700 of FIG. 7. In the graph 700 of FIG. 7, the bottom trace is the input digital signal to the FSK circuit 400 and the upper trace is the resulting FSK.

Figure 8:
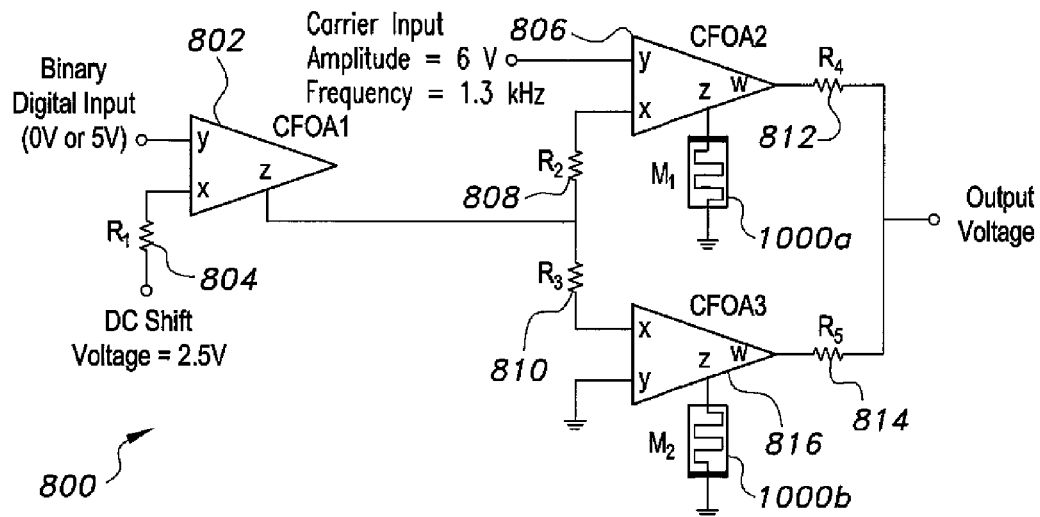
FIG. 8 is a schematic diagram of an embodiment of a binary phase-shift keying (BASK) circuit for use with the memristor circuits of the memristor-based emulators of FIGS. 10A and 10B for generating BPSK signals according to the present invention.

Referring to FIG. 8, a BPSK circuit 800 is shown for generating BPSK signals. BPSK circuit 800 is used in conjunction with a positive memristor circuit 1000a of a positive memristor-based emulator 10a and a negative memristor circuit 1000b of a negative memristor-based emulator 10b, shown in FIGS. 10A and 10B, respectively. The operation of the circuit 800 shown in FIG. 8 can be explained as follows. The current-feedback operational-amplifier based circuit is used to convert a unipolar binary digital input signal into a current. With the sinusoidal input voltage set to zero, when the binary digital input=5 V, the output DC current of a first CFOA (CFOA1) 802 is equally or substantially equally divided between the two equal or substantially equal resistors $R_2$ 808 and $R_3$ 810. These two equal or substantially equal currents resulting from the divided output DC current of the first CFOA (CFOA1) 802 will bias the two memristor circuits 1000a $M_1$ and 1000b $M_2$ respectively connected to the z-terminals of a second CFOA (CFOA2) 806 and a third CFOA (CFOA3) 816 of the BPSK circuit 800.

Figure 10A:
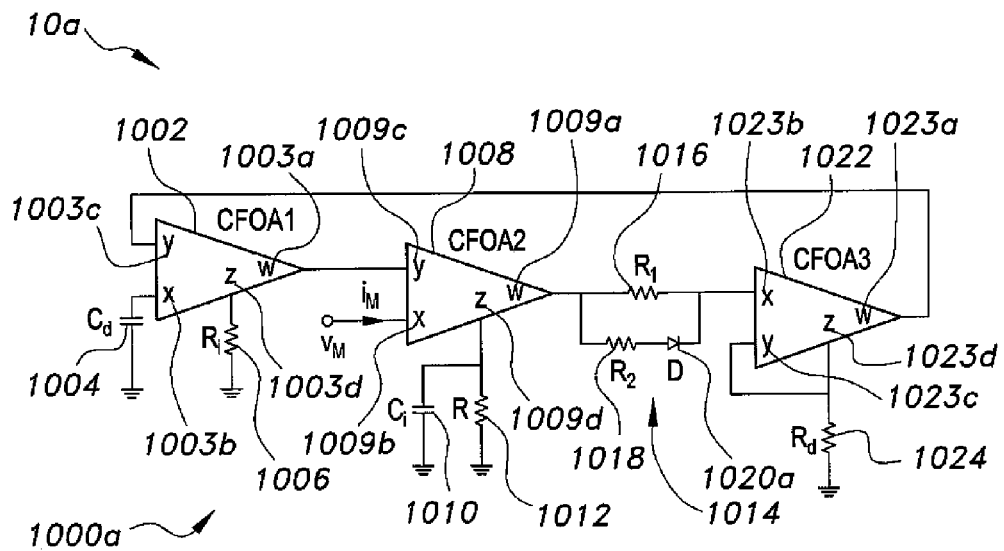
FIG. 10A is a schematic diagram of an embodiment of a positive memristor circuit of a positive memristor-based emulator with a resistor connected in parallel with the capacitor $C_i$ of embodiments of a memristor circuit of a memristor-based emulator for use in digital modulation according to the present invention.
Figure 10B:
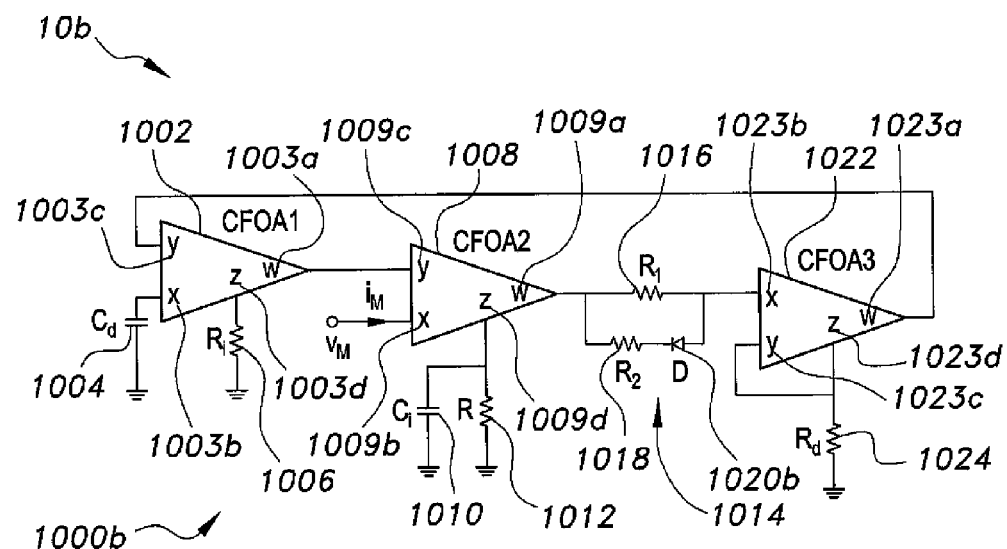
FIG. 10B is a schematic diagram of an embodiment of a negative memristor circuit of a negative memristor-based emulator with a resistor connected in parallel with the capacitor $C_i$ of embodiments of a memristor circuit of a memristor-based emulator for use in digital modulation according to the present invention.

Since the two memristor circuits 1000a and 1000b of FIGS. 10A and 10B are not identical, one is positive and the other is negative, then the resistances of the two memristor circuits 1000a and 1000b will be different. In this regard, one resistance will be relatively small and the other resistance will be relatively large, for example. A similar situation can occur when the binary digital input to the BPSK circuit 800 is zero and the currents in the z-terminals of the second CFOA 806 and the third CFOA 816 will reverse their directions. Again, the resistance of the two memristor circuits 1000a and 1000b will not be equal. With the sinusoidal input voltage applied to the BPSK circuit 800, the sinusoidal voltage drops across the two memristor circuits 1000a and 1000b and will have opposite polarities and different magnitudes, for example.

In the BPSK circuit 800, the output voltage is the superposition of the two voltages across the memristor circuits 1000a and 1000b. Thus, the output voltage will have two opposite phases depending on the binary digital input. The memristor circuits 1000a and 1000b used in BPSK circuit 800 of FIG. 8 are emulated using the memristor circuits 1000a and 1000b shown in FIGS. 10A and 10B, which are modified versions of the memristor circuits 100a and 100b of the memristor-based emulators 1a and 1b of FIGS. 1A and 1B, with a resistance R 1012 connected in parallel with a capacitor C, 1010 to avoid possible saturation of the voltage across the capacitor as a result of the flow of the direct current (DC) biasing current through it. This will convert the integrator built around the second CFOA 806 into a nonideal integrator. A typical BPSK output signal obtained with a resistor $R_1$ 804, the resistor $R_2$ 808, the resistor $R_3$ 810, a resistor $R_4$ 812 and a resistor $R_4$ 814 with $R_2$=$R_3$=20 k$\Omega$, $R_4$=$R_5$=9.1 k$\Omega$ and $R_1$=47 k$\Omega$ is shown in a graph 900 of FIG. 9. In the graph 900 of FIG. 9, the bottom trace is the input digital signal to the BPSK circuit 800 and the upper trace is the resulting BPSK.

Figure 5:
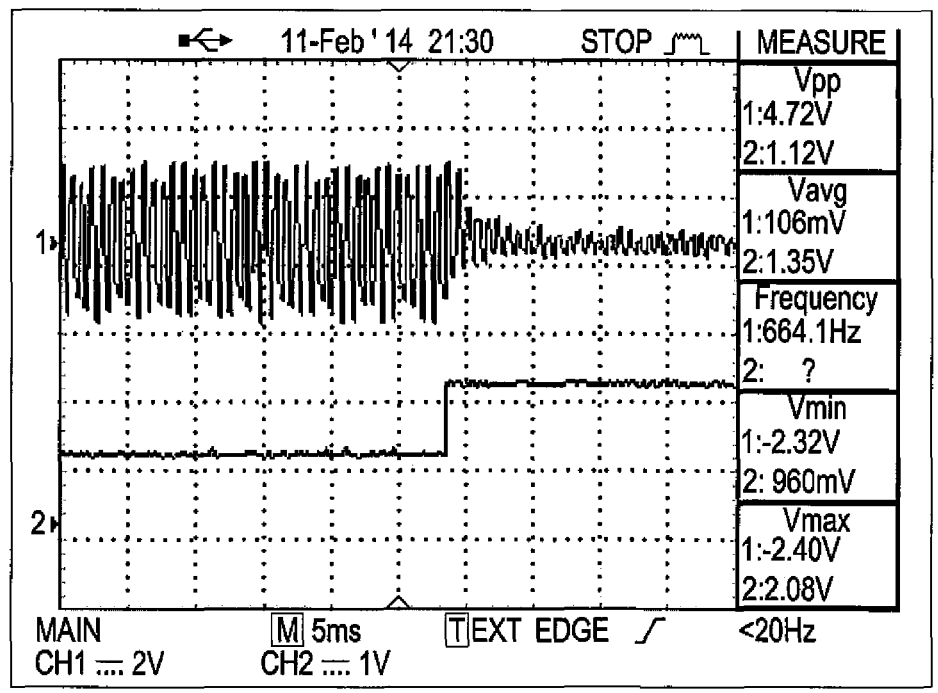
FIG. 5 is a graph of experimental data of the ASK signal generated using the ASK circuit of FIG. 4 with the memristor circuit of the memristor-based emulator of FIG. 1B, where $R_1$=47 kilo-ohms (k$\Omega$) and $R_2$=4.7 k$\Omega$ according to the present invention.
Figure 7:
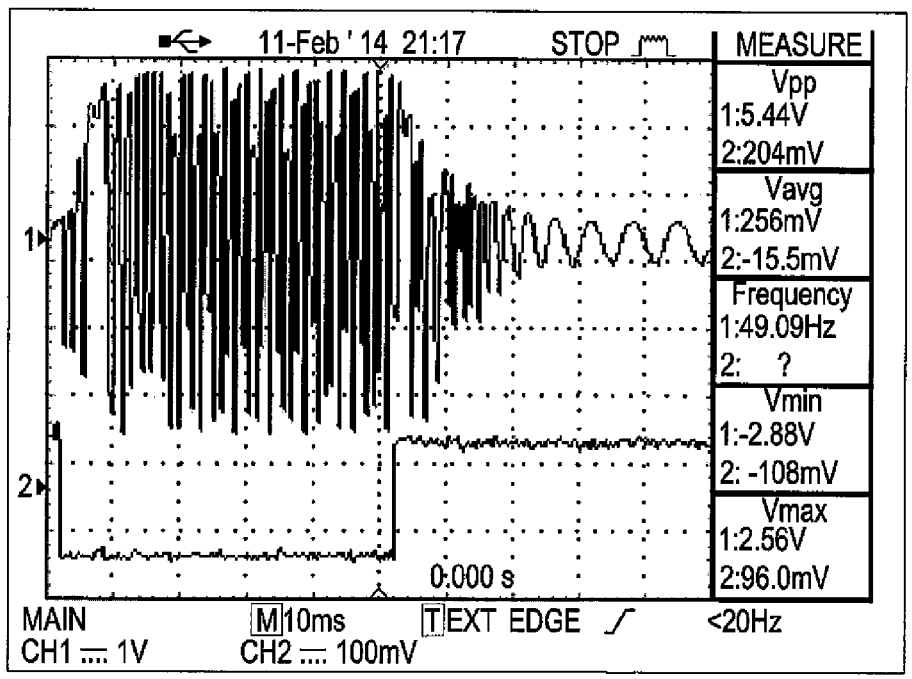
FIG. 7 is a graph of experimental data of the FSK signal generated using the FSK circuit of FIG. 6 with the memristor circuit of the memristor-based emulator of FIG. 1A, where $R_p$=25 k$\Omega$, $C_p$=3.3 nano-farads (nF), and $C_s$=4.7 nF according to the present invention.
Figure 9:
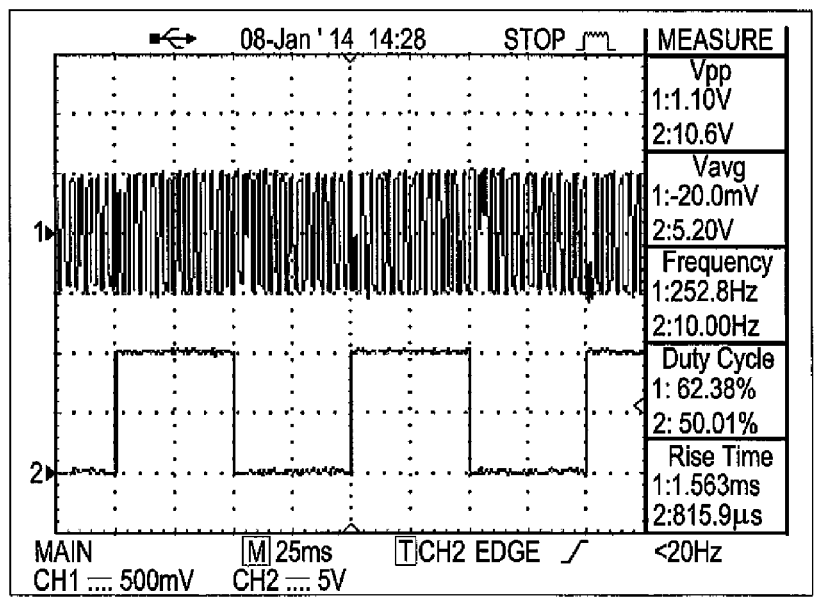
FIG. 9 is a graph of experimental data of the BPSK signal generated using the BPSK circuit of FIG. 8 with the memristor circuits of the memristor-based emulators of FIGS. 10A and 10B, where $R_2$=$R_3$=20 k$\Omega$, $R_4$=$R_5$=9.1 k$\Omega$, and $R_1$=47 k$\Omega$ according to the present invention.

Referring to the graphs 500, 700 and 900 of FIGS. 5, 7 and 9, the signals show a time delay between the transition of the unipolar binary input voltage from 0 to 5V and the change in the output amplitude, frequency and phase respectively. This can be attributed to the time taken by the capacitor $C_i$ to discharge the previous state and acquire the new state. Also, to avoid possible saturation of the voltage across the capacitor $C_i$ 112 of the memristor circuits 100a and 100b of FIGS. 1A and 1B, a resistor can be connected in parallel with the capacitor $C_i$. In this case the memristor circuits 100a and 100b of the memristor-based emulators 1a and 1b of FIGS. 1A and 1B reduce to the memristor circuits 1000a and 1000b of the memristor-based emulators 10a and 10b shown in FIGS. 10A and 10B. In this case the integrator of the schematic diagram 200 of FIG. 2 will be nonideal rather than ideal.

Referring to FIGS. 10A and 10B, the positive memristor circuit 1000a of the positive memristor-based emulator 10a and the negative memristor circuit 1000b of the negative memristor-based emulator 10b are shown. Similar to the decremental memristor circuit 100a of the decremental memristor-based emulator 1a and the incremental memristor circuit 100b of the incremental memristor-based emulator 1b of FIGS. 1A and 1B, respectively, the positive memristor circuit 1000a of the positive memristor-based emulator 10a and the negative memristor circuit 1000b of the negative memristor-based emulator 10b include a first CFOA (CFOA1) 1002. The first CFOA 1002 includes a w-terminal 1003a, an x-terminal 1003b, a y-terminal 1003c, and a z-terminal 1003d. The first CFOA 1002 is in communication with a capacitor $C_d$ 1004 through the x-terminal 1003b of the first CFOA 1002. At the z-terminal 1003d, the first CFOA 1002 is in communication with a resistor $R_i$ 1006.

A second CFOA (CFOA2) 1008 is found in both the positive memristor-based emulator circuit 1000a and the negative memristor-based emulator circuit 1000b. The second CFOA 1008 includes a w-terminal 1009a, an x-terminal 1009b, a y-terminal 1009c, and a z-terminal 1009d. The second CFOA (CFOA2) 1008 through its y-terminal 1009c is in communication with the first CFOA 1002 through its x-terminal 1003b. A voltage $V_M$ carrying a current $i_M$ is in communication with the second CFOA 1008 at the x-terminal 1009b. A resistor R 1012 and a capacitor $C_i$ 1010 are in communication with the second CFOA 1008 through the z-terminal 1009d. The resistor R 1012 and a capacitor $C_i$ 1010 are in a parallel relationship with respect to each other.

A nonlinear resistor 1014 is also included in the positive memristor circuit 1000a of the positive memristor-based emulator 10a and the negative memristor circuit 1000b of the negative memristor-based emulator 10b of FIGS. 10A and 10B. The input current $i_M$ can be integrated by the capacitor C, 1010 and then scaled through the non-linear resistor 1014. The nonlinear resistor 1014 includes a first resistor $R_1$ 1016 and second resistor $R_2$ 1018 that are in a parallel relationship with respect to each other, as shown in FIGS. 10A and 10B. Further included in the nonlinear resistor 1014 of the positive memristor circuit 1000a is a diode D 1020a oriented therein to realize a positive memristor, and included in the nonlinear resistor 1014 of the negative memristor circuit 1000b is diode D 1020b oriented therein to realize a negative memristor. The diode D 1020a and the diode D 1020b can each be a germanium diode as opposed to a light emitting diode (LED), for example. The nonlinear resistor 1014 is in communication with the second CFOA 1008 at the w-terminal 1009a of the second CFOA 1008.

A third CFOA (CFOA3) 1022 is included in the positive memristor circuit 1000a of the positive memristor-based emulator 10a and the negative memristor circuit 1000b of the negative memristor-based emulator 10b of FIGS. 10A and 10B. Similar to the first CFOA 1002 and the second CFOA 1008, the third CFOA 1022 includes a w-terminal 1023a, an x-terminal 1023b, a y-terminal 1023c, and a z-terminal 1023d. The third CFOA 1022 is in communication with the nonlinear resistor 1014 through the x-terminal 1023b of the third CFOA 1022. Further, the w-terminal 1023a of the third CFOA 1022 is in communication with the y-terminal 1003c of the first CFOA 1002. The third CFOA 1022 is also in communication with a resistor $R_d$ 1024 by way of the z-terminal 1023d of the third CFOA 1022. By having the third CFOA 1022 in communication with a resistor $R_d$ 1024, the third CFOA 1022 and the resistor $R_d$ 1024 act as an inverting amplifier associated with the nonlinear resistor 1014 to increase a current gain to increase a difference between the ON value of a resistance and the OFF value of a resistance of the realized memristor, for example, such as realized by the positive memristor circuit 1000a of FIG. 10A and by the negative memristor circuit 1000b of FIG. 10B.

The memristor circuits 100a, 100b, 1000a, and 1000b of the corresponding memristor-based emulators 1a, 1b, 10a, and 10b, can provide several attractive features. For example, the memristor circuits 100a, 100b, 1000a, and 1000b can offer a relatively low input resistance as can enhance suitability for current driving rather than voltage driving. Another advantage the memristor circuits 100a, 100b, 1000a, and 1000b can offer is the desirable use of germanium diodes, as can avoid the use of LEDs. A further advantage the memristor circuits 100a, 100b, 1000a, and 1000b can offer is the use of the CFOA, as such use can avoid gain-bandwidth product limitations of the operational amplifier based circuits.

Also, the memristor circuits 100a, 100b, 1000a, and 1000b of the corresponding memristor-based emulators 1a, 1b, 10a, and 10b have been used for generating digital modulated signals, such as ASK, FSK and BPSK signals. Both the ASK signals and the FSK signals can be generated using one memristor circuit, for example. However, the BPSK signals typically require two memristor circuits, such as a positive-memristor circuit as, for example, the positive memristor circuit 1000a of the memristor-based emulator 10a, and a negative-memristor circuit as, for example, the negative memristor circuit 1000b of the memristor-based emulator 10b. In all cases the unipolar binary digital input is first converted into a current. This current is used to bias the realized memristor by changing its resistance, thus exploiting the inherent memristor characteristic of having two values of resistance; that is an on value, RON, and an off value, ROFF.

It is to be understood that the present invention is not limited to the embodiments described above, but encompasses any and all embodiments within the scope of the following claims.

We claim:

1. A memristor-based emulator for use in digital modulation including a memristor circuit, the memristor circuit comprising:
a first current feedback operational amplifier (CFOA), the first CFOA in communication with a capacitor $C_d$ and in further communication with a resistor $R_i$;
a second CFOA, the second CFOA in communication with the first CFOA and adapted to be in further communication with a voltage $V_M$ to provide an input current $i_M$ for integration by a capacitor $C_i$;
a nonlinear resistor in communication with the second CFOA to scale the integrated input current $i_M$; and
a third CFOA, the third CFOA in communication with the nonlinear resistor and in further communication with the first CFOA and a resistor $R_d$, wherein the third CFOA and the resistor $R_d$ act as an inverting amplifier associated with the nonlinear resistor to increase a current gain to increase a difference between an ON value of a resistance and an OFF value of a resistance of a memristor realized by the memristor circuit.

2. The memristor-based emulator for use in digital modulation according to claim 1, wherein the first CFOA further comprises an x-terminal, a y-terminal, and a z-terminal, the first CFOA in communication with the capacitor $C_d$ at the x-terminal and in further communication with the resistor $R_i$ at the z-terminal.

3. The memristor-based emulator for use in digital modulation according to claim 1, wherein the second CFOA further comprises an x-terminal, a y-terminal, and a z-terminal, the y-terminal of the second CFOA in communication with a w-terminal of the first CFOA, and the x-terminal of the second CFOA adapted to be in communication with the voltage $V_M$.

4. The memristor-based emulator for use in digital modulation according to claim 1, wherein the nonlinear resistor includes a first resistor $R_1$ and second resistor $R_2$ and a diode D.

5. The memristor-based emulator for use in digital modulation according to claim 4, wherein the nonlinear resistor is in communication with the second CFOA at a w-terminal of the second CFOA.

6. The memristor-based emulator for use in digital modulation according to claim 4, wherein the first resistor $R_1$ and the second resistor $R_2$ are in a parallel relationship.

7. The memristor-based emulator for use in digital modulation according to claim 6, wherein the diode D is comprised of germanium.

8. The memristor-based emulator for use in digital modulation according to claim 1, wherein the third CFOA further comprises a w-terminal, an x-terminal, a y-terminal, and a z-terminal, the third CFOA in communication with the nonlinear resistor through the x-terminal of the third CFOA, the w-terminal of the third CFOA in communication with a y-terminal of the first CFOA, and the z-terminal of the third CFOA in communication with the resistor $R_d$.

9. The memristor-based emulator for use in digital modulation according to claim 1, wherein the memristor-based emulator is adapted to be driven by a current.

10. The memristor-based emulator for use in digital modulation according to claim 1, wherein the nonlinear resistor includes a first resistor $R_1$ and a second resistor $R_2$ and a diode D, wherein the diode D is arranged in the nonlinear resistor in a first orientation to realize a decremental memristor and in a second orientation to realize an incremental memristor.

11. The memristor-based emulator for use in digital modulation according to claim 1, wherein the nonlinear resistor includes a first resistor $R_1$ and a second resistor $R_2$ and a diode D, wherein the diode D is arranged in the nonlinear resistor in a first orientation to realize a positive memristor and in a second orientation to realize a negative memristor.

12. The memristor-based emulator for use in digital modulation according to claim 1, wherein the memristor circuit comprises one or more memristor circuits adapted to be used in a digital modulation circuit to generate one or more of an amplitude-shift keying (ASK) output signal, a frequency-shift keying (FSK) output signal and a binary phase-shift keying (BPSK) output signal.

13. A memristor-based emulator for use in digital modulation including a memristor circuit, the memristor circuit comprising:
a first current feedback operational amplifier (CFOA), the first CFOA having a w-terminal, an x-terminal, a y-terminal, and a z-terminal, the first CFOA in communication with a capacitor $C_d$ at the x-terminal of the first CFOA and in further communication with a resistor $R_i$ at the z-terminal of the first CFOA;

a second CFOA, the second CFOA having a w-terminal, an x-terminal, a y-terminal, and a z-terminal, the y terminal of the second CFOA in communication with the w-terminal of the first CFOA, the x-terminal of the second CFOA adapted to be in communication with a voltage $v_M$ to provide an input current $i_M$ that is integrated by a capacitor $C_i$;

a nonlinear resistor including a first resistor $R_1$ and second resistor $R_2$ and a diode D, the nonlinear resistor in communication with the second CFOA at the w-terminal of the second CFOA; and a third CFOA, the third CFOA having a w-terminal, an x-terminal, a y-terminal, and a z-terminal, the third CFOA in communication with the nonlinear resistor through the x-terminal of the third CFOA, the w-terminal of the third CFOA in communication with the y-terminal of the first CFOA, the z-terminal of the third CFOA in communication with a resistor $R_d$, wherein the third CFOA and the resistor $R_d$ act as an inverting amplifier associated with the nonlinear resistor to increase a current gain to increase a difference between an ON value of a resistance and an OFF value of resistance of a memristor realized by the memristor circuit.

14. The memristor-based emulator for use in digital modulation according to claim 13, wherein the first resistor $R_1$ and the second resistor $R_2$ are in a parallel relationship.

15. The memristor-based emulator for use in digital modulation according to claim 13, wherein the diode D is comprised of germanium.

16. The memristor-based emulator for use in digital modulation according to claim 13, wherein the memristor-based emulator is adapted to be driven by a current.

17. The memristor-based emulator for use in digital modulation according to claim 13, wherein the z-terminal of the second CFOA is in communication with the capacitor $C_i$ and a resistor R in a parallel relationship with the capacitor $C_i$.

18. A memristor-based emulator for use in digital modulation including a memristor circuit, the memristor circuit comprising:

a first current feedback operational amplifier (CFOA), the first CFOA having a w-terminal, an x-terminal, a y-terminal, and a z-terminal, the first CFOA in communication with a capacitor $C_d$ at the x-terminal of the first CFOA and in further communication with a resistor $R_i$, at the z-terminal of the first CFOA;

a second CFOA, the second CFOA having a w-terminal, an x-terminal, a y-terminal, and a z-terminal, the y terminal of the second CFOA in communication with the w-terminal of the first CFOA, the x-terminal of the second CFOA adapted to be in communication with a voltage $v_M$ to provide an input current $i_M$ that is integrated by a capacitor $C_i$;

a nonlinear resistor including a first resistor $R_1$ and second resistor $R_2$ in a parallel relationship and further including a germanium diode D, the nonlinear resistor in communication with the second CFOA at the w-terminal of the second CFOA; and a third CFOA, the third CFOA having a w-terminal, an x-terminal, a y-terminal, and a z-terminal, the third CFOA in communication with the nonlinear resistor through the x-terminal of the third CFOA, the w-terminal of the third CFOA in communication with the y-terminal of the first CFOA, the z-terminal of the third CFOA in communication with a resistor $R_d$, wherein the third CFOA and the resistor $R_d$ act as an inverting amplifier associated with the nonlinear resistor to increase a current gain to increase a difference between an ON value of a resistance and an OFF value of resistance of a memristor realized by the memristor circuit, and wherein the memristor-based emulator is adapted to be driven by a current.

19. The memristor-based emulator for use in digital modulation according to claim 18, wherein the diode D of the nonlinear resistor is arranged in the nonlinear resistor in a first orientation to realize at least one of a decremental memristor and a positive memristor, and the diode D of the nonlinear resistor is arranged in the nonlinear resistor in a second orientation to realize at least one of an incremental memristor and a negative memristor.

20. The memristor-based emulator for use in digital modulation according to claim 18, wherein the memristor circuit comprises one or more memristor circuits adapted to be used in a digital modulation circuit to generate one or more of an amplitude-shift keying (ASK) output signal, a frequency-shift keying (FSK) output signal and a binary phase-shift keying (BPSK) output signal.

* * * * *